United States Patent [19]

Mayes

[11] Patent Number: 5,117,125
[45] Date of Patent: May 26, 1992

[54] LOGIC LEVEL CONTROL FOR IMPACT IONIZATION SENSITIVE PROCESSES

[75] Inventor: Michael K. Mayes, San Jose, Calif.

[73] Assignee: National Semiconductor Corp., Santa Clara, Calif.

[21] Appl. No.: 615,071

[22] Filed: Nov. 19, 1990

[51] Int. Cl.$^5$ ............................................. H03K 3/01
[52] U.S. Cl. ................................ 307/296.2; 307/296.8; 307/304
[58] Field of Search .................... 307/296.2, 296.8, 304

[56] References Cited

U.S. PATENT DOCUMENTS

| | | | |
|---|---|---|---|
| 4,705,966 | 11/1987 | Van Zanlen | 307/296.2 |
| 4,820,936 | 4/1989 | Veendrich et al. | 307/296.2 |
| 5,041,739 | 8/1991 | Goto | 307/296.2 |

FOREIGN PATENT DOCUMENTS 53-91649  8/1978  Japan .................. 397/296.2

Primary Examiner—Eugene R. Laroche
Assistant Examiner—R. A. Ratliff
Attorney, Agent, or Firm—Irving S. Rappaport; William H. Murray; Frank M. Linguiti

[57] ABSTRACT

A logic level control circuit prevents impact ionization in a CMOS integrated circuit. The substrate bias voltage of the CMOS integrated circuit is detected by the control circuit and a control signal is provided in response to the detected bias voltage. The bias voltage can be zero volts or negative five volts. If the bias voltage is zero volts, the control signal is a logic level one. If the bias voltage is negative five volts, the control signal is a logic level zero. The control signal is applied to the gate of at least one other controlled device on the integrated circuit for turning the controlled device on and off. The controlled device coupled to a further CMOS device and turning the controlled device on and off prevents impact ionization by allowing the controlled device to alternately divide a voltage level with the further CMOS device or be effectively removed from the circuit.

8 Claims, 3 Drawing Sheets

LOGIC LEVEL CONTROL FOR IMPACT IONIZATION SENSITIVE PROCESSES

BACKGROUND OF THE INVENTION

1. Field of the Invention

The present invention relates to complimentary metal oxide semiconductor (CMOS) devices and, in particular, to a technique for eliminating impact ionization in high density CMOS circuit configurations allowing higher supply levels and, thus, larger dynamic range.

2. Background of the Invention

While the advancement of CMOS technology has resulted in high density processes, a major limitation on the technology has been the allowable drain-to-source voltage ($V_{ds}$) for N-type MOS transistors. The limitation, typically five volts, is due to shallow/sharp junctions and thin gate oxides. These factors result in impact ionization. Thus reliability problems occur in sub-micron processes due to impact ionization during positive five volt to negative five volt switching transients.

Many mixed analog/digital integrated circuits require logic low levels of both zero volts and negative five volts for interfacing purposes. Thus implementation of logic to meet this requirement results in impact ionization problems for sub-micron processes. Impact ionization is a phenomenon that occurs primarily in n-channel MOS devices rather than p-channel because the electron mobility in n-channel devices is higher than the hole mobility of p-channel devices. When the supply voltage is increased above five volts to the point where the allowable $V_{ds}$ of the device is exceeded, electron mobility is such that collisions occur at the drain. These collisions ionize the semiconductor crystal and create electron/hole pairs. As illustrated in FIGS. 1A-C, when this occurs, the drain-to-substrate current increases above the normal leakage to contribute to the total drain current. This causes a slow but permanent threshold shift which results in device failure over a period of time. Additionally, it reduces the output impedance for saturated device applications.

It is known to us lightly doped diffusion (LDD) or increased junction depth. Both of these solutions reduce the field in the oxide eliminating the hot carrier effect. However, both solutions complicate the fabrication process and increase n-channel device sizes. Another solution includes use of cascading techniques. However these techniques require special biasing circuitry.

The above stated problems limit supplies to five volts and thus reduce the maximum possible dynamic range for CMOS analog circuits. If this effect can be eliminated, higher dynamic ranges can be achieved. This would permit the higher density CMOS processes required for digital applications to be integrated with high dynamic range CMOS analog circuitry, taking full advantage of the advancements in the technology.

It is know in the art to solve these problems using complicated process steps which increase device size. It is also known to use cascade type circuit techniques requiring special cascode circuitry, complicated back biasing circuits, and bias generator circuits to provide internal bias changes.

Additionally, it is known in the prior art to provide a second MOS device with a fixed gate voltage in series with an MOS device such the $V_{ds}$ is equally divided across the two devices. This permitted higher voltage swings and preserved high output impedance thereby permitting high gain for an amplifier or high impedance for a current source. Doubling of the dynamic range was possible because the two devices divided the voltage between them. This method is disclosed in U.S. Pat. No. 4,736,117 issued to Wieser issued on Apr. 5, 1988. However the combined devices of Wieser can not be used for applications using both zero volt and negative five volt substrate biasing.

SUMMARY OF THE INVENTION

A logic level control circuit prevents impact ionization in a CMOS integrated circuit. The substrate bias voltage of the CMOS integrated circuit is detected by the control circuit and a control signal is provided in response to the detected bias voltage. The bias voltage can be zero volts or negative five volts. If the bias voltage is zero volts, the control signal is a logic level one. If the bias voltage is negative five volts, the control signal is a logic level zero. The control signal is applied to the gate of at least one controlled device on the inteqrated circuit for turning that controlled device on and off to selectively divide a voltage level in accordance with the bias voltage.

DETAILED DESCRIPTION OF THE INVENTION

Figure 1A:
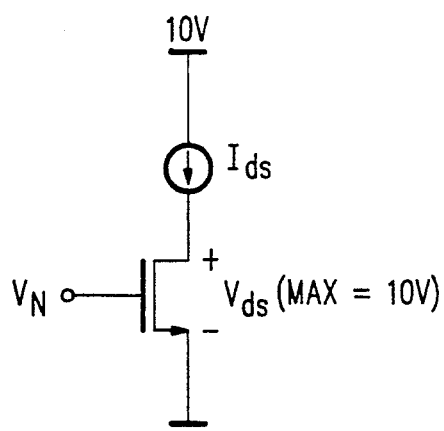
FIG. 1A is a circuit schematic illustrating a conventional n-channel device having a ten volt supply.
Figure 1B:
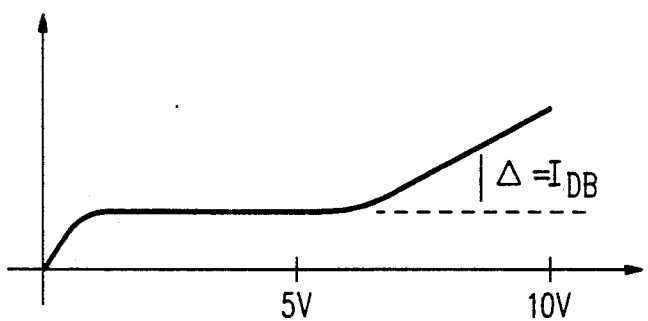
FIG. 1B is a graph illustrating the drain-to-source current of the conventional n-channel device shown in FIG. 1A as a function of supply voltage.
Figure 1C:
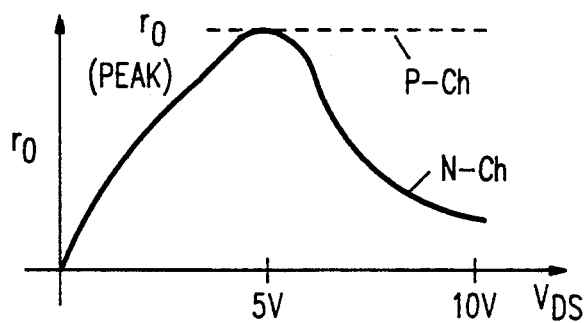
FIG. 1C is a graph illustrating the relationship between output impedance and drain-to-source voltage for a conventional n-channel device.
Figure 2:
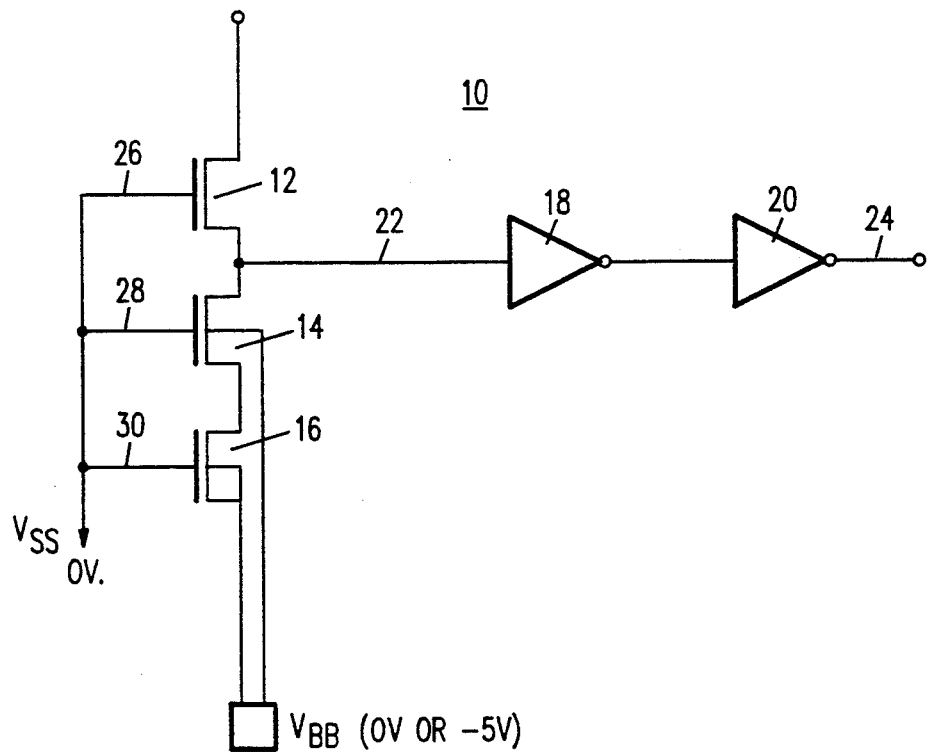
FIG. 2 is a circuit schematic illustrating the logic level control for impact ionization sensitive processes of the present invention.

Referring now to FIG. 2, there is shown logic level control substrate bias detection control circuit 10 of the present invention. Substrate bias detection and control circuit 10 of the present invention detects substrate bias voltage ($V_{BB}$) in impact ionization sensitive processes and provides a control signal in response to the detected substrate bias voltage for eliminating impact ionization in n-channel CMOS devices. The substrate bias voltage levels detected for providing the control signal in logic level control circuit 10 are zero volts and negative five volts.

If the substrate bias voltage $V_{BB}$ of logic level control circuit 10 is zero volts then the control signal, provided on output control line 24 of control circuit 10, is logic level one. If the substrate bias volta $V_{BB}$ in logic level control circuit 10 is negative five volts, then the control signal on output control line 24 is logic level zero. The control signal on output control line 24, having a logic value of either a one or a zero in response to the detected substrate bias voltage $V_{BB}$ of logic level control circuit 10, can be used to control any random logic on an integrated circuit which includes logic level control circuit 10.

When the $V_{BB}$ detected by logic level control circuit 10 is zero volts, transistor device 12 is always on because gate 26 of transistor device 12 is tied to $V_{ss}$ which is zero volts. Furthermore, when $V_{BB}$ is zero volts, both transistor device 14 and transistor device 16 turn off because $V_T$ is approximately equal to seven-tenths of a volt and $V_{gB}$ is equal to zero volts. When both transistor device 14 and transistor device 16 are off, line 22 is pulled high by turned on transistor device 12. When line 22 is thus pulled high by transistor device 12 a high level is applied to inverter 18 which provides a bias level at its output. The high level applied to inverter 18 is inverted and then inverted a second time by inverter 20 to provide a high logic level output at output line 24.

When the $V_{BB}$ detected by logic level control circuit 10 is negative five volts, transistor device 12 is turned on because $V_{gB}$ is zero volts which is greater than the negative $V_T$ of transistor device 12. Transistor device 14 and transistor device 16 are thus turned on because $V_{gB}$ is much greater than the threshold voltage for an n-channel device. These two devices, transistor device 14 and transistor device 16, are much stronger than the p-channel transistor device 12. Therefore transistor device 14 and transistor device 16 pull line 22 low. Line 22 is twice inverted by inverter 18 and inverter 20 as previously described causing output control line 24 to go low.

Because transistor device 14 and transistor device 16 are in series with each other, any possible hot carrier effects due to voltage differences between line 22 and ground are prevented. Transistor device 14 and transistor device 16 act as voltage dividers, splitting the total voltage between line 22 and ground across each other while permitting the internal substrate bias to remain fixed.

Figure 3:
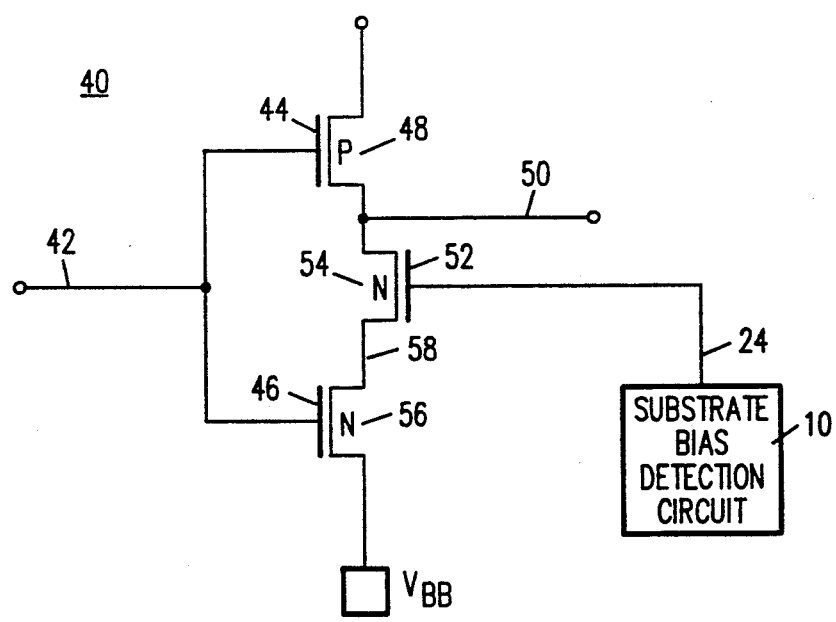
FIG. 3 is a circuit schematic illustrating an inverter circuit controlled by the logic level control circuit of FIG. 2.

Referring now to FIG. 3, there is shown inverter circuit 40. Inverter circuit 40 is controlled by output control line 24 of logic level control circuit 10 in accordance with the substrate bias voltage detected by logic level control circuit 10. The control signal of output control line 24 is applied to inverter circuit 40 at gate 52 of transistor device 54. In a conventional inverter circuit an n-channel device corresponding to transistor device 54 is not present between two devices such as transistor device 48 and transistor device 56. However transistor device 54 is provided in inverter circuit 40 in order to permit control of inverter circuit 40 by logic level control circuit 10 of the present invention.

When the $V_{BB}$ detected by logic level control circuit 10 is zero volts, thereby causing a high logic level control signal to be applied to gate 52 of transistor device 54 by way of line 24 from logic level control circuit 10, inverter circuit 40 functions as follows. Device 54 of inverter circuit 40 turns on because the level on gate 52 of transistor device 54 is five volts. Thus p-channel transistor device 48 and n-channel transistor device 56 function as a conventional inverter circuit substantially as if device 54 were not present in inverter circuit 40. Therefore a high logic level applied to gate 44 and gate 46 by way of input line 42 causes a low logic level to appear at output 50 of inverter circuit 40. Conversely, a low level applied to input 42 of inverter circuit 40 causes a high level to appear at output 50 of inverter circuit 40.

If the $V_{BB}$ detected by logic level control circuit 10 is negative five volts, thereby causing a zero volt control signal to be applied to gate 52 of transistor device 54 by control line 24 inverter circuit 40 functions as follows. When the voltage input to inverter circuit 40, as applied to input line 42, is negative five volts, p-channel device 48 turns on and n-channel device 56 turns off. This pulls the voltage level at output line 50 high. Hot carrier injection is eliminated because the ten volts typically found across one n-channel device is now dropped across two series n-channel devices; n-channel device 54 and n-channel device 56. Further, n-channel device 54 and n-channel device 56 are conventional devices and do not require special biasing to operate or special processing steps to fabricate.

When the input voltage of inverter circuit 40, as applied to input line 42, is positive five volts, p-channel device 48 turns off. Device 56 turns on hard pulling node 58 close to negative five volts. This voltage level is typically within $10^{-8}$ volts of the negative five volt level. Since output control line 24 from logic control circuit 10 is at zero volts, thereby applying a zero volt level to gate 52 of device 54, device 54 is then allowed to turn on. In the manner previously described for transistor device 56, transistor device 54 is turned on hard, thereby pulling the output level at output line 50 very close to negative five volts.

Thus transistor device 54 is either: 1) effectively removed from inverter 40, or 2) serving as a voltage divider within inverter 40, in accordance with the substrate bias $V_{BB}$ detected by logic level control circuit 10. This permits inverter 40 to operate with either zero or negative five volts substrate bias.

Figure 4:
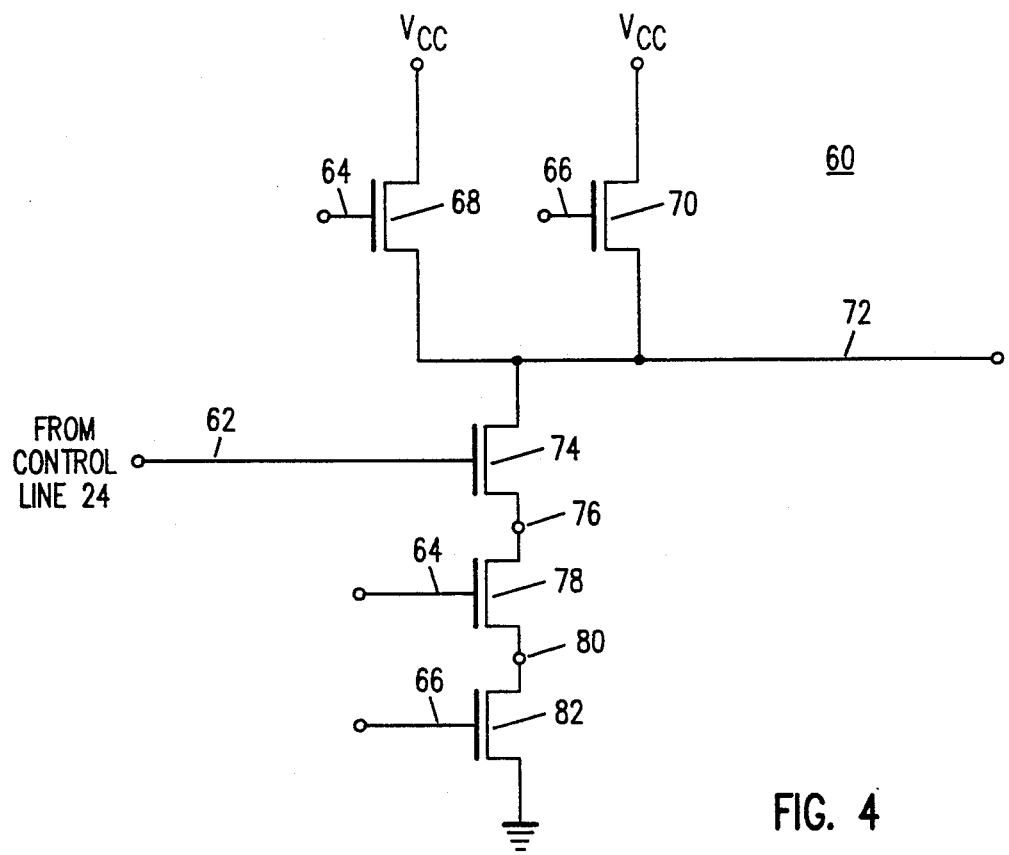
FIG. 4 is a circuit schematic illustrating a NAND circuit controlled by the logic level control circuit of FIG. 2.

Referring now to FIG. 4, there is shown NAND gate 60. NAND gate 60 is controlled by output control line 24 of logic level control circuit 10. Output control line 24 of logic level control circuit 10 is coupled to NAND gate control line 62 of NAND gate 60 and is applied to the gate of transistor device 74. If $V_{BB}$ is zero volts, output control line 24 of logic level control circuit 10 is high. When both NAND gate input lines 64, 66 are high, NAND gate output line 72 is low in accordance with the conventional truth table of a NAND gate. Both transistor device 78 and transistor device 82 are turned on when NAND gate input lines 64, 66 are both high, thereby pulling node 76 substantially close to $V_{BB}$. Because output control line 24 of logic level control circuit 10 is high when $V_{BB}$ is zero volts, transistor device 74 is also turned on thereby causing NAND gate output line 72 to also be pulled down to $V_{BB}$. If either input line 64, 66 is low, then at least one transistor device 78, 82 is off causing node 76 to be pulled up to $V_{cc}$ subscripts while NAND gate input lines 64, 66 pull NAND gate output line 72 to a logic one by way of either transistor device 68 or transistor device 70.

If $V_{BB}$ is negative five volts, output control line 24 of logic level control circuit 10 is zero volts. When that NAND gate input lines 64, 66 are high, node 76 is pulled to $V_{BB}$ which is negative five volts. This causes the gate-to-drain voltage of transistor device 74 to rise so that NAND gate output line 72 is pulled low. If NAND gate input line 64 and/or NAND gate input line 66 are low then node 76 floats while transistor device 68 or transistor device 70 pulls NAND gate output line 72 up to a logic level one. Thus, NAND gate 60 performs the conventional functions of a conventional NAND gate regardless of whether $V_{BB}$ is zero volts or negative five volts.

Figure 5:
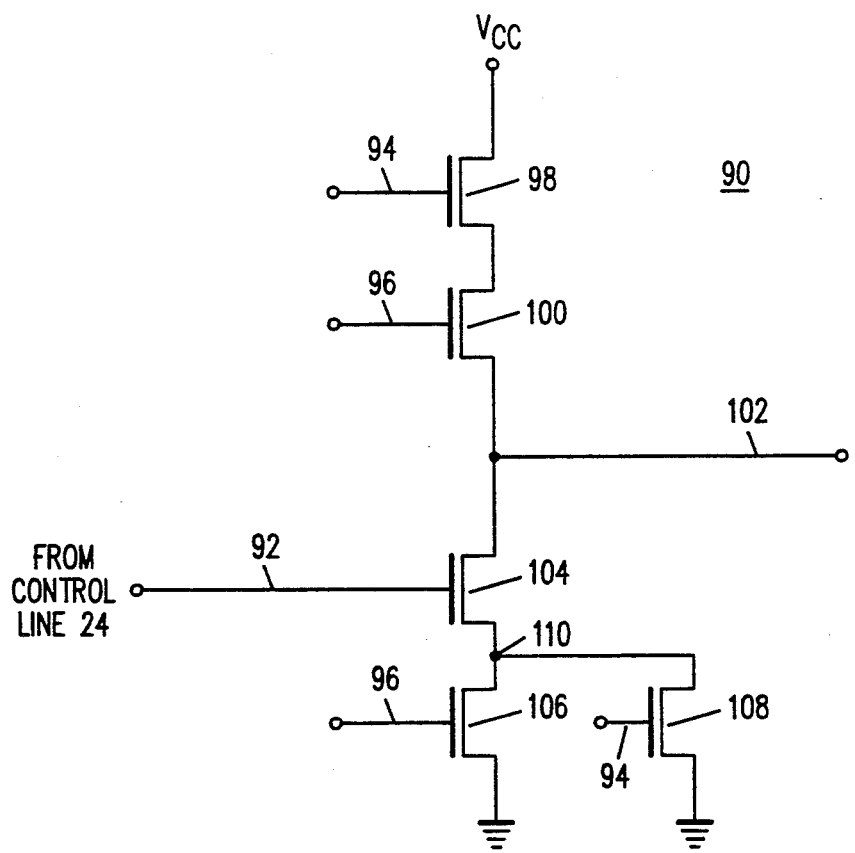
FIG. 5 is a circuit schematic illustrating a NOR circuit controlled by the logic level control circuit of FIG. 2.

Referring now to FIG. 5, there is shown NOR gate 90. NOR gate 90 is controlled by output control line 24 of logic level control circuit 10. Output control line 24 of logic level control circuit 10 is coupled to NOR control line 92 of NOR gate 90 and is applied to the gate of transistor device 104. NOR gate 90, when coupled to output control line 24 of logic level control circuit 10, functions equally well whether $V_{BB}$ is zero volts or negative five volts. In the case where $V_{BB}$ is zero volts, output control line 24 of logic level control circuit 10 is high and device transistor 104 of NOR gate 90 is turned on. If NOR gate input line 94 and/or NOR gate input line 96 is high while Transistor device 104 is on, then node 110 is pulled low by transistor device 106 and/or transistor device 108. Since the gate of transistor device 104 is high and transistor device 104 is on, NOR gate output line 102 is pulled down to approximately zero volts. If NOR gate input line 94 and NOR gate input line 96 are both low then both transistors 106 and 108 are both off. At the same time, because NOR gate input lines 94, 96 are zero, transistor devices 98, 100 are on thereby pulling NOR gate output line 102 high.

When $V_{BB}$ is negative five volts and output control line 24 is zero volts, NOR gate 90 operates as follows. If NOR gate input line 94 and/or NOR gate input line 96 are high, then transistor device 106 and/or transistor device 108 turn on pulling node 110 to negative five volts. Transistor 104 turns on and NOR gate output line 102 is thus pulled low. Since transistor device 104 is in series with transistor device 106 and transistor device 108, the ten volts is split between the two. So no impact ionization occurs in NOR gate 90. If both NOR gate input line 94 and NOR gate input line 96 are both zero volts, transistor device 106 and transistor device 108 are both off, Transistor device 98 and transistor device 100 are thus turned on thereby pulling NOR gate output line 102 high.

It will be understood by those skilled in the art that several logic gates or even an entire array (not shown) of circuits may be controlled using a single control circuit 10. However, several inverters 18, 20 may be required to drive an entire array.

It will be understood that various changes in the details, materials and arrangement of the parts which have been described and illustrated in order to explain the nature of this invention, may be made by those skilled in the art without departing from the principle and scope of the invention as expressed in the following claims.

I claim:

1. A logic level control circuit for preventing impact ionization in a CMOS integrated circuit operable at a plurality of substrate bias voltage levels, comprising:
   means for determining a single substrate bias voltage level of said plurality of substrate bias voltage levels;
   means for providing a voltage divider control signal in accordance with said determined single bias voltage level;
   a controlled device having at least first and second states and means for receiving said voltage divider control signal to select one state of said first and second states in accordance with said voltage divider control signal; and,
   said controlled device further comprising voltage divider means for selectively dividing a voltage level in accordance with said selected state.

2. The logic level control circuit of claim 1, wherein said voltage divider means divides said voltage level between said voltage divider means and said controlled device.

3. The logic level control circuit of claim 1, wherein said voltage divider means is adapted to divide said voltage level when said detected bias voltage is substantially less than zero volts and not divide said voltage level when said detected bias voltage is substantially equal to zero volts.

4. The logic level control circuit of claim 1, wherein said controlled device is adapted to perform respective first and second controlled device functions when said controlled device is in said first and second states.

5. The logic level control circuit of claim 4, wherein said first and second controlled device functions are identical.

6. The logic level control circuit of claim 5, wherein said first and second controlled device functions comprise at least one logic function.

7. The logic level control circuit of claim 1, wherein said voltage divider means provides a divided voltage level and said divided voltage level is applied to said controlled device for energizing said controlled device.

8. The logic level control circuit of claim 1, wherein said means for receiving said bias level control signal comprises gate means for selectively dividing a voltage.

* * * * *